United States Patent
Kim (10) Patent No.: US 9,567,662 B2
(45) Date of Patent: Feb. 14, 2017

(54) SPLIT MASK AND ASSEMBLING APPARATUS FOR ASSEMBLING A MASK FRAME ASSEMBLY INCLUDING THE SPLIT MASK

(75) Inventor: Yong-Hwan Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 1078 days.

(21) Appl. No.: 13/338,567

(22) Filed: Dec. 28, 2011

(65) Prior Publication Data

US 2012/0279445 A1   Nov. 8, 2012

(30) Foreign Application Priority Data

May 6, 2011   (KR) ......................... 10-2011-0043077

(51) Int. Cl.
| | |
|---|---|
| C23C 16/04 | (2006.01) |
| C23C 14/04 | (2006.01) |
| H01L 51/00 | (2006.01) |
| H01L 51/56 | (2006.01) |

(52) U.S. Cl.
CPC ......... *C23C 14/042* (2013.01); *H01L 51/0011* (2013.01); *H01L 51/56* (2013.01)

(58) Field of Classification Search
CPC ...... C23C 14/042; C23C 16/042; C23C 14/12; H01L 51/0011; H01L 51/56
USPC .... 118/504, 720, 721, 505; 269/104; 29/428
See application file for complete search history.

(56) References Cited

U.S. PATENT DOCUMENTS

| | | | | |
|---|---|---|---|---|
| 2,577,029 | A * | 12/1951 | Moorehead | B25B 5/108 24/494 |
| 3,296,850 | A * | 1/1967 | Fiore | 72/351 |
| 4,989,654 | A * | 2/1991 | Berkeley | B23Q 3/103 144/1.1 |
| 5,711,195 | A * | 1/1998 | Koelling | B23B 31/021 269/104 |
| 6,501,214 | B1 * | 12/2002 | Sakamoto | H01J 29/07 313/407 |
| 7,316,260 | B2 * | 1/2008 | Itani et al. | 164/341 |
| 7,704,326 | B2 * | 4/2010 | Hagiwara | C23C 14/042 118/504 |
| 7,987,812 | B2 * | 8/2011 | Kim | B05B 15/045 118/504 |

(Continued)

FOREIGN PATENT DOCUMENTS

| | | |
|---|---|---|
| CN | 1293444 A | 5/2001 |
| CN | 1302075 A | 7/2001 |

(Continued)

OTHER PUBLICATIONS

Chinese Office Action for 201210033210.1 dated May 25, 2015; Kim.

(Continued)

*Primary Examiner* — Monica Carter
*Assistant Examiner* — Mahdi H Nejad
(74) *Attorney, Agent, or Firm* — Lee & Morse, P.C.

(57) ABSTRACT

Provided is a split mask including a stick main body in which a deposition pattern is formed, a clamping portion extending from opposing ends of the stick main body away from the stick main body, wherein the clamping portion includes a first clamping portion extending horizontally from the stick main body, and a second clamping portion extending diagonally from the stick main body.

11 Claims, 4 Drawing Sheets

(56) References Cited

U.S. PATENT DOCUMENTS

| | | | | |
|---|---|---|---|---|
| 8,402,917 B2* | 3/2013 | Ko | C23C 14/042 | 118/506 |
| 8,550,032 B2* | 10/2013 | Park | C23C 14/042 | 118/504 |
| 8,613,433 B2* | 12/2013 | Poole | B25B 5/12 | 269/228 |
| 8,646,406 B2* | 2/2014 | Ahn | B05C 21/005 | 118/301 |
| 8,757,088 B2* | 6/2014 | Lee | C23C 14/042 | 118/504 |
| 8,852,346 B2* | 10/2014 | Lee | C23C 14/042 | 118/720 |
| 8,915,212 B2* | 12/2014 | Lee | | 118/504 |
| 8,915,213 B2* | 12/2014 | Park | C23C 14/042 | 118/504 |
| 8,925,480 B2* | 1/2015 | Kim | C23C 14/042 | 118/504 |
| 8,960,524 B2* | 2/2015 | Okuno et al. | | 228/112.1 |
| 2001/0018309 A1* | 8/2001 | Nishiki | H01J 9/142 | 445/30 |
| 2003/0101932 A1* | 6/2003 | Kang | C23C 14/042 | 118/504 |
| 2003/0201711 A1* | 10/2003 | Abiko | C23C 14/042 | 313/504 |
| 2003/0221614 A1* | 12/2003 | Kang | C23C 14/042 | 118/504 |
| 2004/0020435 A1* | 2/2004 | Tsuchiya | C23C 14/042 | 118/723 VE |
| 2004/0074587 A1* | 4/2004 | Koerwien | B29C 70/222 | 156/93 |
| 2004/0104197 A1* | 6/2004 | Shigemura | C23C 14/042 | 216/20 |
| 2004/0163592 A1* | 8/2004 | Abiko | C23C 14/042 | 118/715 |
| 2005/0072359 A1* | 4/2005 | Kim | C23C 14/042 | 118/720 |
| 2006/0012290 A1* | 1/2006 | Kang | C23C 14/042 | 313/504 |
| 2006/0103289 A1* | 5/2006 | Kim | B05B 15/045 | 313/402 |
| 2006/0110663 A1* | 5/2006 | Kim | C23C 14/042 | 430/5 |
| 2007/0017895 A1* | 1/2007 | Yotsuya | G03F 1/14 | 216/41 |
| 2008/0000420 A1* | 1/2008 | Kim | C23C 14/042 | 118/504 |
| 2009/0127236 A1 | 5/2009 | Hong et al. | | |
| 2009/0137180 A1* | 5/2009 | Sung | C23C 14/042 | 445/60 |
| 2009/0297768 A1* | 12/2009 | Ko | B23K 31/02 | 428/136 |
| 2010/0021829 A1* | 1/2010 | Kang | H01L 27/3211 | 430/5 |
| 2010/0055810 A1* | 3/2010 | Sung | C23C 14/042 | 438/22 |
| 2010/0148414 A1* | 6/2010 | Poole | B25B 5/12 | 269/228 |
| 2010/0192856 A1* | 8/2010 | Sung | C23C 14/042 | 118/721 |
| 2011/0048323 A1* | 3/2011 | Kondo | C23C 14/042 | 118/500 |
| 2011/0067630 A1* | 3/2011 | Ko | C23C 14/042 | 118/721 |
| 2011/0139069 A1* | 6/2011 | Ahn | C23C 14/042 | 118/504 |
| 2011/0139357 A1* | 6/2011 | Lee | B23K 26/0846 | 156/229 |
| 2011/0146573 A1* | 6/2011 | Park | C23C 14/042 | 118/712 |
| 2011/0168087 A1* | 7/2011 | Lee | C23C 14/042 | 118/504 |
| 2011/0171768 A1* | 7/2011 | Hong | C23C 14/042 | 438/34 |
| 2011/0179996 A1* | 7/2011 | Park | C23C 14/042 | 118/504 |
| 2011/0220019 A1* | 9/2011 | Lee | C23C 14/042 | 118/504 |
| 2011/0229633 A1* | 9/2011 | Hong | H01L 51/0011 | 427/162 |
| 2011/0265714 A1* | 11/2011 | Lee | C23C 14/04 | 118/504 |
| 2012/0090176 A1* | 4/2012 | Stancel | F24J 2/5256 | 29/890.033 |
| 2012/0145076 A1* | 6/2012 | Shin | G03F 1/00 | 118/504 |
| 2012/0174862 A1* | 7/2012 | Lee | C23C 14/042 | 118/504 |
| 2012/0174863 A1* | 7/2012 | Park | C23C 14/042 | 118/504 |
| 2012/0183676 A1* | 7/2012 | Sonoda | C23C 14/042 | 427/8 |
| 2012/0222287 A1* | 9/2012 | Wilturner | B41F 15/36 | 29/559 |
| 2012/0240850 A1* | 9/2012 | Kobayashi | C23C 16/042 | 118/504 |
| 2012/0266813 A1* | 10/2012 | Hong | C23C 14/044 | 118/505 |
| 2012/0279444 A1* | 11/2012 | Hong | C23C 14/042 | 118/504 |
| 2012/0279445 A1* | 11/2012 | Kim | H01L 51/0011 | 118/504 |
| 2012/0282445 A1* | 11/2012 | Kim | C23C 14/042 | 428/209 |
| 2012/0325143 A1* | 12/2012 | Kang | C23C 14/042 | 118/504 |
| 2013/0040047 A1* | 2/2013 | Karaki | C23C 14/042 | 427/66 |
| 2013/0133573 A1* | 5/2013 | Joo | C23C 14/042 | 118/504 |
| 2013/0199443 A1* | 8/2013 | Kim | B05C 21/005 | 118/504 |
| 2013/0273746 A1* | 10/2013 | Kawato | H01L 51/0008 | 438/758 |
| 2013/0298826 A1* | 11/2013 | Park | B05C 21/005 | 118/504 |
| 2013/0318774 A1* | 12/2013 | Kang | B05C 21/005 | 29/592 |
| 2014/0033975 A1* | 2/2014 | Oh | H01L 21/02104 | 118/504 |
| 2014/0065355 A1* | 3/2014 | Kang | C23C 14/042 | 428/136 |
| 2014/0120796 A1* | 5/2014 | Kim | G03F 7/0015 | 445/66 |
| 2014/0130735 A1* | 5/2014 | Kim | H01L 51/0011 | 118/504 |
| 2014/0131667 A1* | 5/2014 | Chang | H01L 51/56 | 257/40 |
| 2014/0137798 A1* | 5/2014 | Ahn | B05C 21/005 | 118/504 |
| 2014/0147949 A1* | 5/2014 | Hong | C23C 14/042 | 438/46 |
| 2014/0150721 A1* | 6/2014 | Oh | C23C 14/042 | 118/504 |
| 2014/0158044 A1* | 6/2014 | Han | C23C 14/042 | 118/504 |
| 2014/0158045 A1* | 6/2014 | Lee | C23C 14/042 | 118/505 |
| 2014/0230219 A1* | 8/2014 | Lee | C23C 14/042 | 29/428 |
| 2014/0272135 A1* | 9/2014 | Chang et al. | | 427/248.1 |
| 2014/0312318 A1* | 10/2014 | Choi | H01L 27/3272 | 257/40 |
| 2014/0331926 A1* | 11/2014 | Kim | B23K 37/0408 | 118/504 |
| 2015/0007767 A1* | 1/2015 | Ko | B05B 15/0481 | 118/504 |

(56) References Cited

U.S. PATENT DOCUMENTS

| | | | |
|---|---|---|---|
| 2015/0007768 A1* | 1/2015 | Lee | H01L 51/56 118/504 |
| 2015/0011033 A1* | 1/2015 | Ko | H01L 51/56 438/34 |
| 2015/0026947 A1* | 1/2015 | Han | C23C 14/042 29/428 |
| 2015/0034005 A1* | 2/2015 | Ko | C23C 14/042 118/504 |
| 2015/0040826 A1* | 2/2015 | Jung et al. | 118/504 |
| 2015/0047560 A1* | 2/2015 | Kang | C23C 14/042 118/504 |
| 2015/0050767 A1* | 2/2015 | Kuriyama | C23C 14/042 438/34 |
| 2015/0101536 A1* | 4/2015 | Han | C23C 14/042 118/721 |
| 2015/0102329 A1* | 4/2015 | Lee | H01L 51/0011 257/40 |
| 2015/0165464 A1* | 6/2015 | Baek | C23C 14/042 118/504 |
| 2016/0005970 A1* | 1/2016 | Kwen | H01L 51/0011 118/504 |
| 2016/0079532 A1* | 3/2016 | Yi | H01L 51/0002 438/758 |
| 2016/0122860 A1* | 5/2016 | Kim | H01L 51/56 118/505 |
| 2016/0126507 A1* | 5/2016 | Ko | H01L 27/3244 438/34 |
| 2016/0208392 A1* | 7/2016 | Ikenaga | C23C 14/24 |

FOREIGN PATENT DOCUMENTS

| | | |
|---|---|---|
| CN | 101798670 A | 8/2010 |
| JP | 2004-311336 A | 11/2004 |
| JP | 2006-111941 A | 4/2006 |
| JP | 2006-124761 A | 5/2006 |
| JP | 2012-233253 A | 11/2012 |
| KR | 10-1999-0020138 A | 3/1999 |
| KR | 10-2009-0052203 | 5/2009 |
| KR | 10-2009-0123590 | 12/2009 |
| KR | 10-2009-0124356 A | 12/2009 |
| WO | WO 2010/045504 A1 | 4/2010 |
| WO | WO 2010/054274 A2 | 5/2010 |
| WO | WO 2011/034011 A1 | 3/2011 |

OTHER PUBLICATIONS

Taiwanese Office Action dated Sep. 24, 2015 in Corresponding Taiwanese Patent Application No. 100149899.
Japanese Office Action dated Sep. 29, 2015 in Corresponding Japanese Patent Application No. 2012-061610.

* cited by examiner

SPLIT MASK AND ASSEMBLING APPARATUS FOR ASSEMBLING A MASK FRAME ASSEMBLY INCLUDING THE SPLIT MASK

CROSS-REFERENCE TO RELATED PATENT APPLICATION

This application claims the benefit of Korean Patent Application No. 10-2011-0043077, filed on May 6, 2011, in the Korean Intellectual Property Office, the disclosure of which is incorporated herein in its entirety by reference.

BACKGROUND OF THE INVENTION

1. Field of the Invention

Embodiments relate to a split mask and assembly apparatus for assembling a mask frame assembly including the split mask.

2. Description of the Related Art

In general, among display devices, organic light-emitting display devices have a wide viewing angle, an excellent contrast, and a high response speed.

The organic light-emitting display devices have a stacked structure (in which an emissive layer is inserted between an anode and a cathode) and realize colors based on the principle that light is emitted as holes and electrons injected from the anode and the cathode into the emissive layer recombine. However, it is difficult to obtain high light emission efficiency with the above structure. Thus, other intermediate layers such as an electron injection layer, an electron transport layer, a hole transport layer, and a hole injection layer are selectively interposed between the electrodes and the emissive layer.

The electrodes and the intermediate layers, including the emissive layer, may be formed using various methods. One such method is deposition. In order to manufacture organic light-emitting display devices using a deposition method, a fine metal mask (FMM) having the same pattern as a pattern of a thin film to be formed is aligned on a substrate, and a raw material of the thin film is deposited to form the thin film having the desired pattern.

A split mask assembly is formed by attaching a plurality of split masks to a frame. When attaching the split masks to the frame, the split masks are pulled tight in a lengthwise direction. If the split masks are coupled to the frame while not in a taut state, waves are formed in bodies of the split masks, which decrease adhesion between the split masks and a substrate, and deteriorate precision of deposition. Thus, when attaching the split masks to the frame, the split masks are pulled tight in the lengthwise direction and then attached to the frame.

SUMMARY OF THE INVENTION

According to one or more embodiments, a split mask may include a stick main body in which a deposition pattern is formed, a clamping portion extending from opposing ends of the stick main body away from the stick main body, wherein the clamping portion includes a first clamping portion extending horizontally from the stick main body and a second clamping portion extending diagonally from the stick main body.

The first clamping portion may include first and second extensions extending from an inner portion of each of the opposing ends, and the second clamping portion may include first and second extensions extending from outer most portions of each of the opposing ends.

The first and second extensions of the first clamping part and the first and second extensions of the second clamping part may be symmetrically disposed with respect to a horizontal center of the stick main body.

According to one or more embodiments, an assembly apparatus for assembling a mask frame assembly may include a first tensioning instrument detachably connected to a first clamping portion, the first clamping portion extending from an inner portion of an end of a stick main body of a split mask, the first tensioning instrument configured to apply tension along the length of the stick main body, and a second tensioning instrument detachably connected to a second clamping portion, the second clamping portion extending from an outer most portion of the end of the stick main body, the second tensioning instrument configured to apply tension along the width of the stick main body.

The first clamping portion may extend horizontally from the end of the stick main body, and the second clamping portion may extend diagonally from the end of the stick main body.

The first tensioning instrument may include a first tensioning stage horizontally aligned with the end of the stick main body, and a first tensioning unit on the first tensioning stage, the first tensioning unit being detachably connected to the first clamping portion to apply tension to the first clamping portion.

The first tensioning unit may include a first clamper detachably connected to the first clamping portion, and a first tensioner connected to the first clamper, the first tensioner being configured to pull the first clamper.

The second tensioning instrument may include a second tensioning stage diagonally aligned with the end of the stick main body, and a second tensioning unit on the second tensioning stage, the second tensioning unit being detachably connected to the second clamping portion to apply tension to the second clamping portion.

The second tensioning unit may include a second clamper detachably connected to the second clamping portion, and a second tensioner connected to the second damper, the second tensioner being configured to pull the second clamper.

The second tensioning stage may be rotatable between a first position and a second position.

The second tensioning stage may be configured to move horizontally toward and away from the first tensioning instrument.

The first tensioning instrument may correspond in position with the inner portion of the end of the stick main body and the second tensioning instrument may correspond in position with the outer portion of the end of the stick main body. The first and second extensions of the first and second tensioning instruments may be symmetrically formed along a horizontal center of the stick main body.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments will now be described more fully with reference to the accompanying drawings, in which exemplary embodiments are shown.

Figure 1:
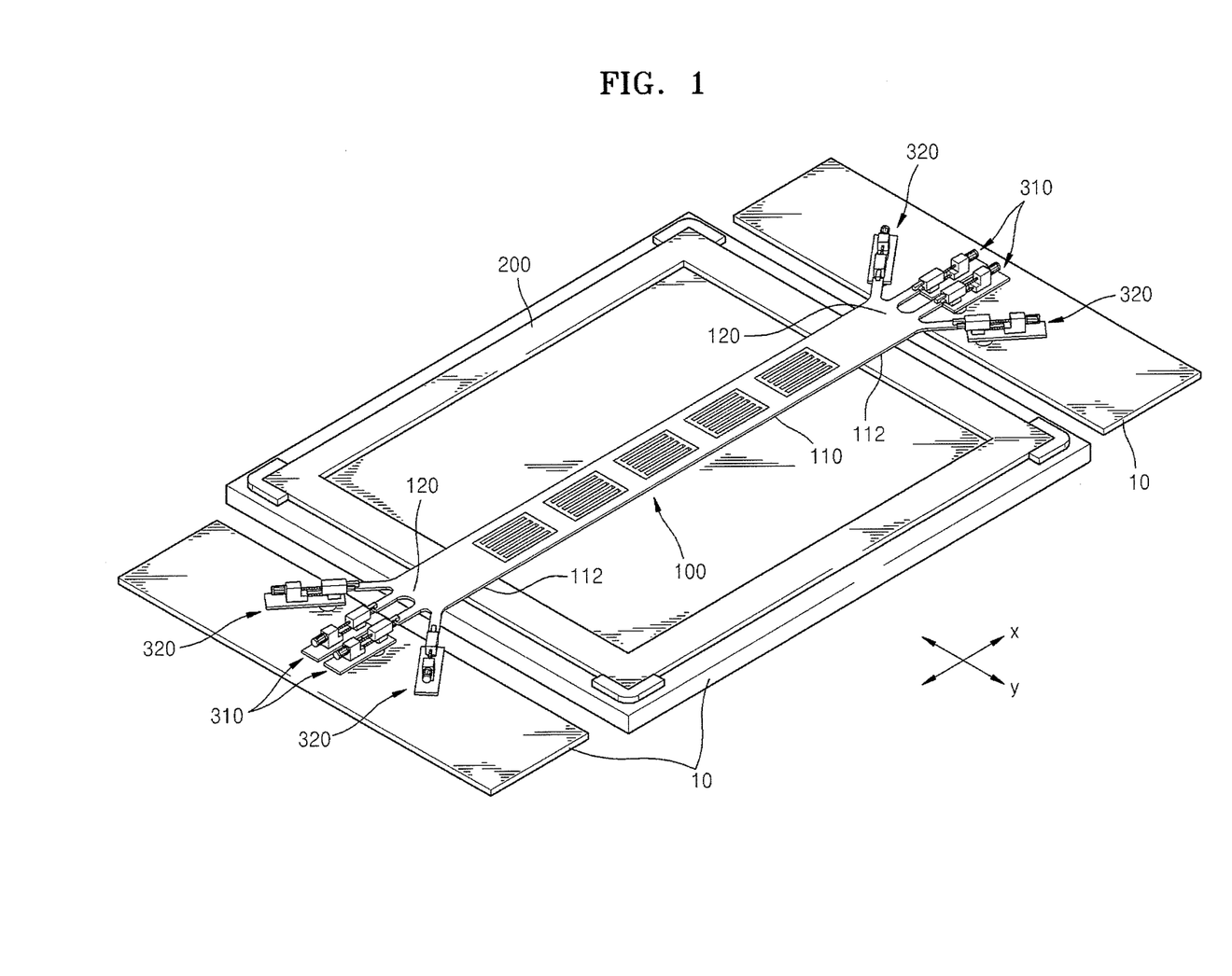
FIG. 1 illustrates a perspective view of a split mask and an assembly apparatus for assembling a mask frame assembly according to an embodiment.

FIG. 1 illustrates a split mask 100 and an assembly apparatus for assembling a mask frame assembly that is formed by coupling the split mask 100 and a frame 200. As illustrated in FIG. 1, the split mask 100 is pulled tight as a first tensioning instrument 310 and a second tensioning instrument 320 of the assembly apparatus clamp onto a clamping portion 120 formed at two ends portions of a stick main body 110 of the split mask 100 and tension is applied to the split mask 100. As tension is applied to the split mask 100, a portion of the split mask 100 that crosses the frame 200, hereinafter a bonding portion 112, may be welded to the frame 200 using a welding apparatus (not shown) to thereby couple the bonding portion 112 to the frame 200. The clamping portion 120 may be removed, i.e., cut off, when welding is finished.

Figure 2:
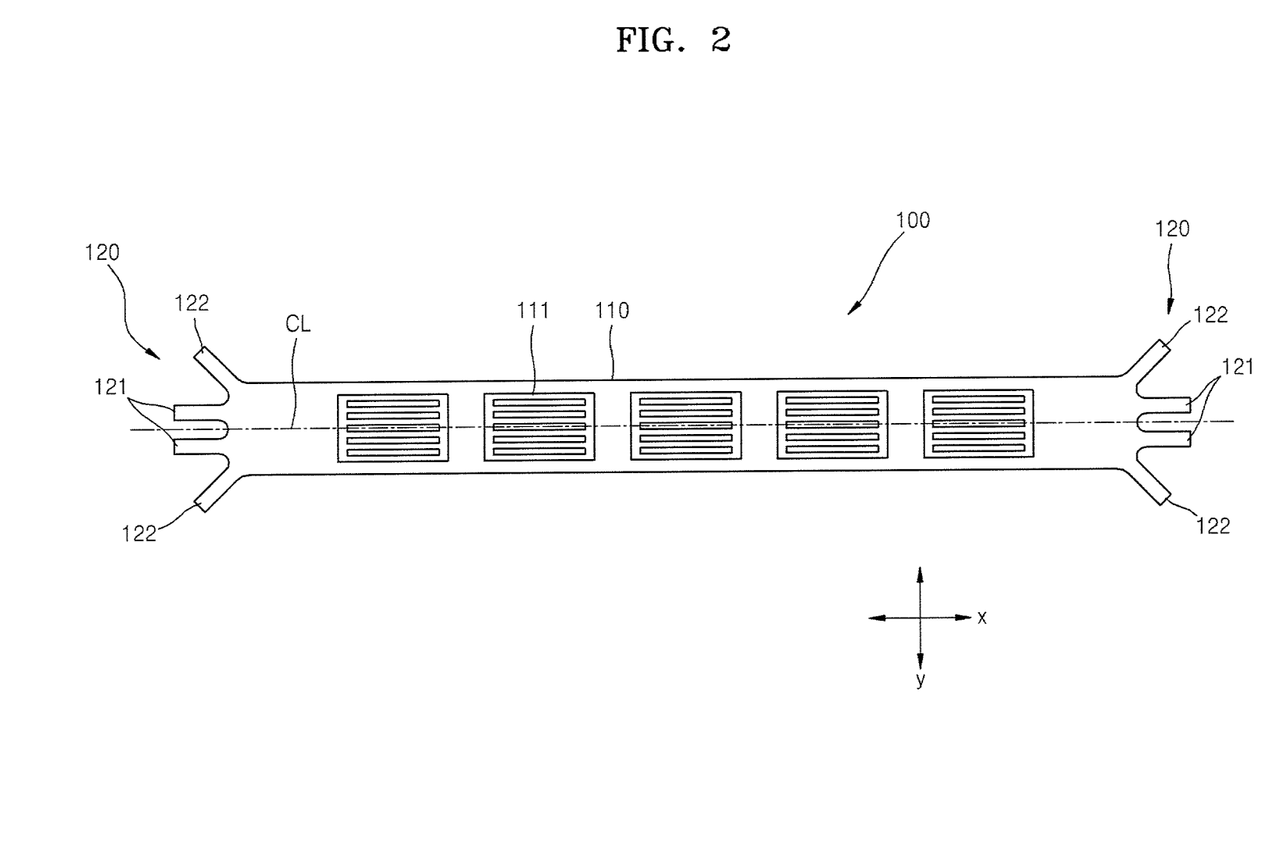
FIG. 2 illustrates a plan view of the split mask illustrated in FIG. 1.

FIG. 2 illustrates a plan view of the split mask 100 illustrated in FIG. 1.

Hereinafter, a structure of the split mask 100 will be described with reference to FIG. 2.

The split mask 100 may include the stick main body 110 in which deposition patterns 111 are formed and the clamping portion 120 formed at two opposing end portions of the stick main body 110.

The stick main body 110 may be welded to the frame 200 (see FIG. 1) to form the mask frame assembly. The clamping portion 120 may be formed in order to apply tension to the stick main body 110 when welding the stick main body 110 to the frame 200 and may be removed after welding, as described above. It should be understood that two clamping portions 120 may be provided, one for each opposing end of the stick main body 110. For simplicity, one clamping portion will be described herein.

The clamping portion 120 may include a first clamping portion 121 and a second clamping portion 122. The first clamping portion 121 may extend in a lengthwise direction (X-direction) away from the stick main body 110. For example, the first clamping portion 121 may extend horizontally from an end of the stick main body 110. The first clamping portion 121 may be pulled or extended horizontally, to provide tension along the length of the stick main body 110 (lengthwise direction). The second clamping portion 122 may extend in a diagonal direction between the lengthwise direction (X-direction) and a width direction (Y-direction) away from the stick main body 110. For example, the second clamping portion 122 may extend diagonally from an end of the stick main body. The second clamping portion 122 may be pulled or extended diagonally, to provide tension along the width of the stick main body 110 (width direction). Thus, tension may be effectively applied in not only the lengthwise direction (X) but also in the width direction (Y) of the split mask 100. In other words, although the first and second tensioning instruments 310 and 320 (which apply tension to the split mask 100), may be detachably connected to only the opposing end portions of the split mask 100, in the lengthwise direction as illustrated in FIG. 1, the second clamping portion 122 (which permits the split mask 100 to be pulled in the diagonal direction as described above), facilitates tension to be applied to the split mask 100 in a width (Y) direction, or along the width of the split mask 100. Thus, application of tension in both the lengthwise direction (X) (along the length of the stick main body 110) and the width direction (Y) (along the width of the stick main body 110) may be achieved simply by using tensioning instruments at each of the opposing end portions of the split mask 100.

Figure 3:
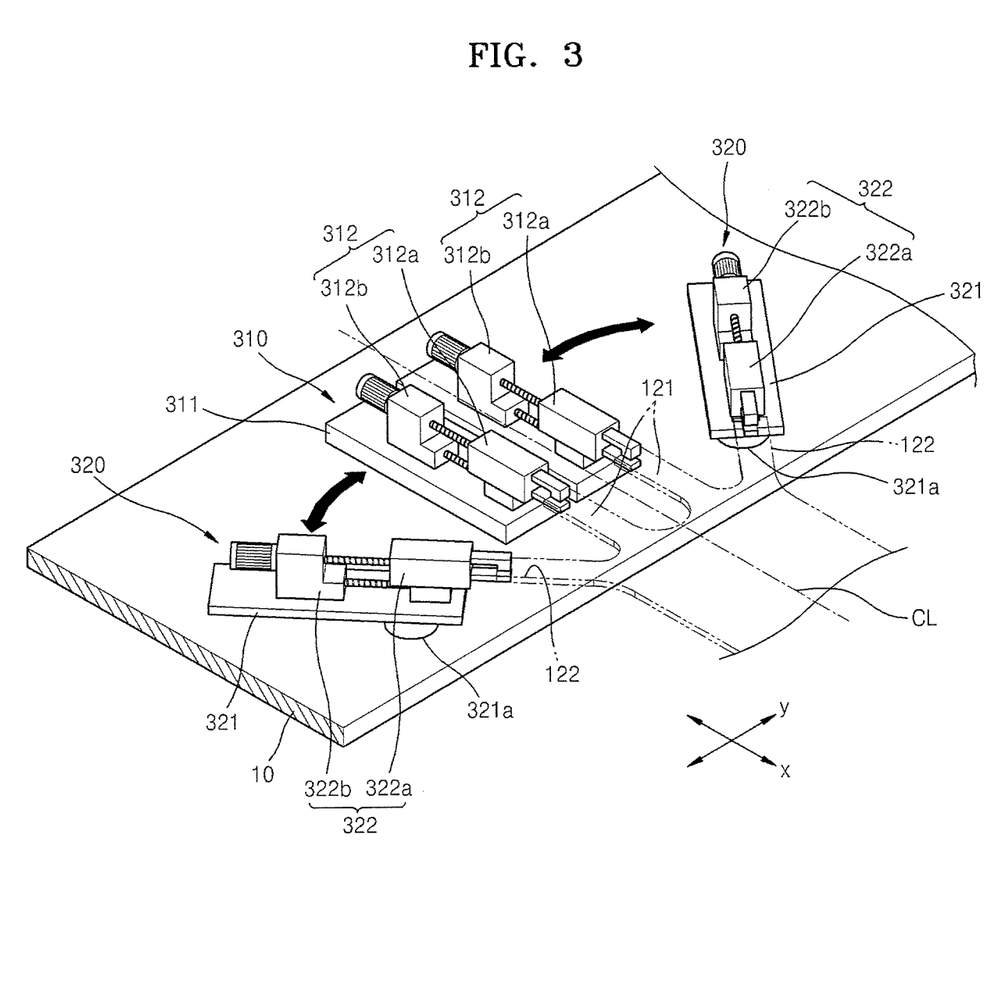
FIG. 3 illustrates an expanded perspective view of the assembly apparatus for assembling a mask frame assembly illustrated in FIG. 1.

FIG. 3 illustrates an expanded perspective view of the assembly apparatus illustrated in FIG. 1.

As shown in FIG. 3, the first tensioning instrument 310, which pulls the first clamping portion 121 in the lengthwise direction, and the second tensioning instrument 320, which pulls the second clamping portion 122 in the diagonal direction, may be included in the assembly apparatus. A structure of the assembly apparatus will be described below.

The first clamping portion 121 may include first and second extensions, which extend horizontally from an inner portion of the end of the stick main body 110. The second clamping portion 122 may include first and second extensions, which extend diagonally from an outer most portion of the end of the stick main body. The first and second extensions of the first and second clamping portions 121 and 122 may be symmetrically disposed along a central line CL or horizontal center of the stick main body 110. If they are not symmetrically disposed, tension in the width direction (Y) may not be balanced when applying tension to the split mask 100, and waves may be generated due to distortion.

The structure of the split mask 100 may be simplified by forming the second clamping portion 122, which is to be pulled in the diagonal direction, in an outer portion of the end of the stick main body 110, around the first clamping portion 121 in the width direction (Y). For example, the first and second extensions of the first clamping portion 121 may be disposed between the first and second extensions of the second clamping portion 122. If the first and second extensions of the second clamping portion 122 are formed between the first and second extensions of the first clamping portion 121, the structure of the split mask 100 may be complicated, and the arrangement of the first and second tensioning instruments 310 and 320 corresponding to the first and second clamping portions 121 and 122, respectively, may also be complicated.

Next, structures of the first and second tensioning instruments 310 and 320, respectively corresponding to the first and second clamping portions 121 and 122 will be described with reference to FIG. 3.

As described above, the first tensioning instrument 310 may pull the first clamping portion 121 in the lengthwise direction (X), and the second tensioning instrument 320 may pull the second clamping portion 122 in the diagonal direction.

As shown in FIG. 3, a separate first tensioning instrument 310 may be provided for each of the first and second extensions of the first clamping portion 121. Similarly, a separate second tensioning instrument 320 may be provided for each of the first and second extensions of the second clamping portion 122. For simplicity, the configuration and mechanism of only one first tensioning instrument 310 and one second tensioning instrument 320 will be described.

The first tensioning instrument 310 may include a first tensioning stage 311 installed on a support plate 10 and a first tensioning unit 312 installed on the first tensioning stage 311. The first tensioning unit 312 may include a first clamper 312a that clamps onto the first clamping portion 121 and a first tensioner 312b that applies tension to the first clamper 312a by moving the first clamper 312a in the lengthwise direction (X). Consequently, when the first clamper 312a is clamped onto the first clamping portion 121, while the first tensioner 312b is in operation, the first clamper 312a may move on the first tensioning stage 311 in the lengthwise direction (X) to pull the first clamping portion 121. The first tensioner 312b may be any instrument that can realize a straight reciprocating motion, such as a typical ball screw, a linear motor, or an air cylinder. Also, the first clamper 312a may be any instrument that can clamp onto the first clamping portion 121. The first tensioning unit 312 may have the same structure as that of a tensioning unit used in a conventional assembly apparatus. Thus description herein will focus on a function thereof, and detailed description of the structure of the first tensioning unit 312 will be omitted.

The second tensioning instrument 320 may include a second tensioning stage 321 installed on the support plate 10 and a second tensioning unit 322 installed on the second tensioning stage 321. The second tensioning unit 322 may includes a second damper 322a that clamps onto the second clamping portion 122 and a second tensioner 322b that applies tension to the second clamper 322a by moving the second clamper 322a in the diagonal direction. Consequently, when the second clamper 322a is clamped onto the second clamping portion 122, while the second tensioner 322b is in operation, the second clamper 322a may move on the second tensioning stage 321 in the diagonal direction to pull the second clamping portion 122. The second tensioner 322b may be any instrument that can realize a straight reciprocating motion, such as a typical ball screw, a linear motor, or an air cylinder. Also, the second clamper 322a may be any instrument that can clamp onto the second clamping portion 122. Like the first tensioning unit 312, the second tensioning unit 322 may have the same structure as that of a tensioning unit used in a conventional assembly apparatus. Thus, description herein will focus on a function thereof, and detailed description of the structure of the second tensioning unit 322 will be omitted.

The second tensioning stage 321 may be rotatably installed on a rotation axis 321a that is fixed to the supporting plate 10. Thus, for example, the second tensioning stage may be rotatable between a first position and a second position. When the second tensioning stage is in the first position, the second tensioning stage and the first tensioning stage may be in alignment. When the second tensioning stage is in the second position, the second tensioning stage may not be in alignment with the first tensioning stage. Further, in the second position, the second tensioning stage may be in alignment with the second clamping portion 122. During operation, the second tensioning stage 321 may be diagonally disposed relative to the first tensioning stage 311. For example, the second tensioning stage 321 may be rotated away from the first tensioning stage 311, from the first position to the second position, as illustrated in FIG. 3. In the second position, the second tensioning stage 321 may be coupled to the second clamping portion 122 to apply tension to the second clamping portion 122 in a diagonal direction, relative to the end of the stick main body 110. When not in operation, the second tensioning stage 321 may be rotated back to the first position, i.e., parallel to the first tensioning stage 311, in the lengthwise direction.

It should be understood that when tension is to be applied to a conventional split mask including only the first clamping portion 121, i.e., not to the split mask 100 of the current embodiment, both the first and second tensioning stages 311 and 321 may be disposed parallel to one another, in the lengthwise direction, to perform an operation.

Also, since the first and second tensioning instruments 310 and 320 correspond to the first and second clamping portions 121 and 122, respectively, the first and second tensioning instruments 310 and 320 may be symmetrically arranged with respect to the center line CL in the lengthwise direction, like the first and second clamping portions 121 and 122. For example, two first tensioning instruments 310 may be disposed between two second tensioning instruments 320 proximate an end of the stick main body 110. The position of the two second tensioning instruments 320 may correspond with an outermost portion of the end of the stick main body 100.

Assembling the mask frame assembly, using the assembly apparatus and the split mask 100, may be performed as described below.

First, the split mask 100 and the frame 200 may be prepared as illustrated in FIG. 1. The frame 200 may form an outline or support of the mask frame assembly. The frame 200 may have a rectangular shape with four sides and a central opening portion. The bonding portion 112 of the split mask 100 may be affixed to a pair of opposite sides of the frame 200.

To this end, the clamping portion 120 formed at the two ends of the split mask 100, which may be welded, may be clamped and pulled by the first tensioning instrument 310 and the second tensioning instrument 320. The second tensioning stage 321 of the second tensioning instrument 320 may be disposed diagonally relative to the first tensioning stage 321 of the first tensioning instrument 310. The first tensioning instrument 310 may clamp onto the first clamping portion 121 to pull the first clamping portion 121. The second tensioning instrument 320 may clamp onto the second clamping portion 122 to pull the second clamping portion 122.

Thus, tension may be applied to the split mask 100 along the width and length of the split mask 100. Tension may also be applied in the width direction by a component of tension applied by the second tensioning instrument 320, which is arranged in the diagonal direction, as described above.

Accordingly, waves in the stick main body 110 of the split mask 100 may be reduced not only in the lengthwise direction (X) but also in the width direction (Y), thereby significantly increasing planarity of the split mask 100. That is, although the first and second tensioning instruments 310 and 320 may be installed at the two opposing end portions in the lengthwise direction (X), tension may be applied in both the lengthwise direction (X) and the width direction (Y), thereby reducing waves.

The bonding portion 112 may be welded to the frame 200 so as to secure the split mask 100.

Then, when welding is completed, the clamping portion 120 may be cut off from the bonding portion 112 to remove the clamping portion 120.

When the welding of a first split mask 100 is completed, a second split mask 100 may be welded in the same manner. That is, the first and second tensioning instruments 310 and 320 may be used to clamp onto the first and second clamping portions 121 and 122 of the second split mask 100 so as to apply tension to the second split mask 100, and then the bonding portion 112 may be welded to the frame 200 while tension is applied to the second split mask 100. Tension may be applied also in the width direction (Y) due to tension applied in the diagonal direction by the second tensioning instrument 310, and thus welding may be performed in a condition under which waves are greatly reduced.

Then, likewise, after welding is completed, the clamping portion 120 may be cut off from the bonding portion 112 to remove the clamping portion 120.

By welding the split mask 100 to the frame 200 one by one, the mask frame assembly may be completely assembled.

Thus, by using the split mask 100 and the assembly apparatus as described above, the split mask 100 may be coupled to the frame 200 while tension is applied to the split mask 100 both in the lengthwise direction (X) and the width direction (Y) when assembling the mask frame assembly. Consequently, waves are reduced, thereby manufacturing a more precise mask frame assembly.

The mask frame assembly assembled in this manner may be used in various thin film deposition operations including a patterning operation of an organic emissive layer.

Figure 4:
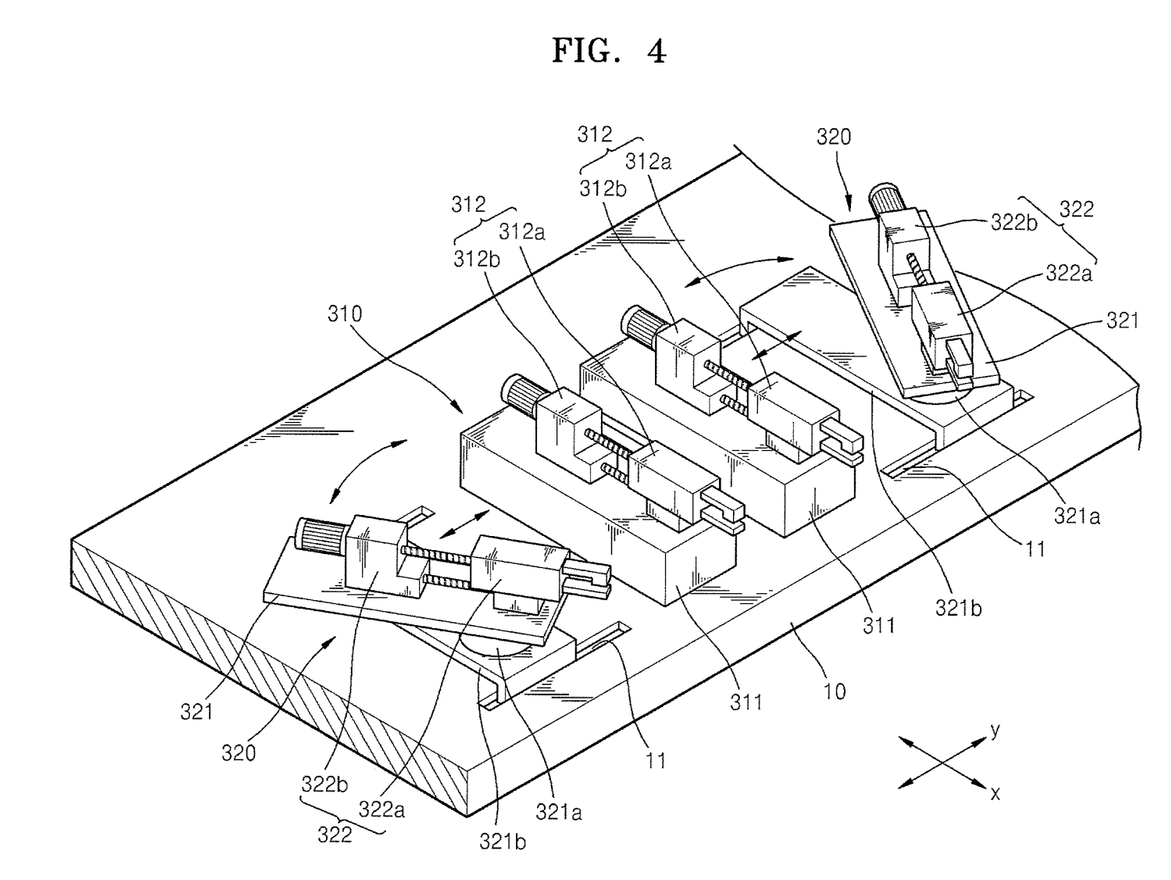
FIG. 4 illustrates a perspective view of another example of the assembly apparatus illustrated in FIG. 3.

FIG. 4 illustrates a perspective view of another example of the assembly apparatus illustrated in FIG. 3.

As described above, according to an embodiment, the second tensioning instrument 320 may rotate between the diagonal direction and the lengthwise direction. The second tensioning instrument 320 may also be configured to move in the width direction (Y) as illustrated in FIG. 4. That is, a guide groove 11 may be formed in the support plate 10 and a slide plate 321b may be provided to support and move the second tensioning instrument 320 along the guide groove 11. The second tensioning stage 321 may be rotatably installed on the slide plate 321b.

In this manner, the second tensioning instrument 320 may rotate not only between a position corresponding to the lengthwise direction (X) and a position corresponding to the diagonal direction but may also move horizontally toward and away from the first tensioning instrument 310. Thus, a distance between the first tensioning instrument 310 and the second instrument 320 may be increased or reduced by moving the slide plate 321b. As the position of the second tensioning instrument 320 may be modified, the second tensioning instrument 320 may be adaptable to various standards of split masks 100, in which the positions of the first clamping portion 121 and the second clamping portion 122 may vary. Accordingly, embodiments may accommodate various standards of the split mask 100 as well as reduce waves in the lengthwise direction (X) and the width direction.

As the conventional FMM is formed to have a large surface area, etching error with respect to formation of patterns is increased and significant drooping of a center portion of the FMM may occur. For this reason, a split mask type mask frame assembly formed by attaching a plurality of split masks to a frame may be preferred. Also, if problems occur in some of the split masks of the mask frame assembly, only the corresponding split masks are to be exchanged.

One problem with conventional split masks, however, is that tension is applied only in the lengthwise direction. As such, waves in a width direction are not removed. As larger display devices have become more popular, there is an increasing demand for split masks with larger widths. As such, there is also a growing need to remove waves in a width direction. It has been found, however, that an assembly apparatus including instruments positioned along both the length and width of a split mask can be a complicated structure that is costly to manufacture.

In contrast, the split masks and the assembly apparatus for assembling a mask frame assembly, according to embodiments, provides a simplified structure capable of reducing or eliminating waves in the lengthwise direction and the width direction of the split masks, simply by using tensioning instruments at opposing ends of the split masks. The mask frame assembly, according to embodiments, assembled in a deposition operation, as described, may facilitate stable and precise patterning.

While embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An assembly apparatus for assembling a mask frame assembly, the assembly apparatus comprising:
   a support plate;
   a first tensioning instrument detachably connected to a first clamping portion, the first clamping portion extending horizontally from an inner portion of an end of a stick main body of a split mask, a deposition pattern being formed in the stick main body, the first tensioning instrument applying tension in a length direction of the stick main body;
   a second tensioning instrument detachably connected to a second clamping portion, the second clamping portion extending diagonally from an outer most portion of the end of the stick main body, the second tensioning instrument applying tension in a width direction of the stick main body and the length direction of the stick main body, the second tensioning instrument including:
      a second tensioning stage diagonally aligned with the end of the stick main body, the second tensioning stage being installed on the support plate; and
      a second tensioning unit on the second tensioning stage, the second tensioning unit being detachably connected to the second clamping portion to apply tension to the second clamping portion; and
   a slide plate to support and move the second tensioning instrument in the width direction, the second tensioning stage being installed on the slide plate, the second tensioning stage being rotatable with respect to the slide plate.

2. The assembly apparatus of claim 1, wherein the first tensioning instrument includes:
   a first tensioning stage horizontally aligned with the end of the stick main body; and
   a first tensioning unit on the first tensioning stage, the first tensioning unit being detachably connected to the first clamping portion to apply tension to the first clamping portion.

3. The assembly apparatus of claim 2, wherein the first tensioning unit includes:
   a first clamper detachably connected to the first clamping portion; and
   a first tensioner connected to the first clamper, the first tensioner being configured to pull the first damper.

4. The assembly apparatus of claim 1, wherein the second tensioning unit includes:
   a second clamper detachably connected to the second clamping portion; and
   a second tensioner connected to the second clamper, the second tensioner being configured to pull the second clamper.

5. The assembly apparatus of claim 1, wherein the second tensioning stage is rotatable between a first and second position.

6. The assembly apparatus of claim 5, wherein the second tensioning stage is configured to move horizontally toward and away from the first tensioning instrument.

7. The assembly apparatus of claim 1, wherein the first tensioning instrument corresponds in position with the inner portion of the end of the stick main body, and the second tensioning instrument corresponds in position with the outer portion of the end of the stick main body.

8. The assembly apparatus of claim 7, wherein first and second extensions of the first and second tensioning instruments are symmetrically formed along a horizontal center of the stick main body.

9. The assembly apparatus of claim 1, further comprising a guide groove in the support plate.

10. The assembly apparatus of claim 9, wherein the slide plate moves the second tensioning instrument along the guide groove.

11. The assembly apparatus of claim 1, wherein the rotatability of the second tensioning stage with respect to the slide plate is about a vertical rotation axis.

\* \* \* \* \*